Oct. 3, 1972 P. J. W. JOCHEMS ET AL 3,695,955

METHOD OF MANUFACTURING AN ELECTRIC DEVICE E.G. A SEMICONDUCTOR DEVICE

Filed March 10, 1970

2 Sheets-Sheet 1

INVENTORS
PIETER J.W. JOCHEMS
REINIER DE WERDT
BY

AGENT

METHOD OF MANUFACTURING AN ELECTRIC DEVICE E.G. A SEMICONDUCTOR DEVICE

Filed March 10, 1970

INVENTORS
PIETER J.W. JOCHEMS
REINIER DE WERDT
BY
Frank R. Trifari
AGENT

United States Patent Office 3,695,955
Patented Oct. 3, 1972

3,695,955

METHOD OF MANUFACTURING AN ELECTRIC DEVICE e.g. A SEMICONDUCTOR DEVICE

Pieter Johannes Wilhelmus Jochems and Reinier de Werdt, both of Emmasingel, Eindhoven, Netherlands Filed Mar. 10, 1970, Ser. No. 18,197
Claims priority, application Netherlands, Mar. 14, 1969, 6903930
Int. Cl. H01l *7/00, 7/50;* C23f *17/00*
U.S. Cl. 156—11 7 Claims

ABSTRACT OF THE DISCLOSURE

The invention relates to a method of manufacturing an electric device, in which a substrate has to be provided by etching for example with a fine contact pattern in two layers consisting of a less noble metal and a nobler metal respectively. It has been found that presumably due to the formation of a galvanic element the less noble metal layer dissolves particularly rapidly. This can be prevented by covering the nobler metal layer and a strip of the less noble metal layer with an insulating layer prior to etching of the last-mentioned layer.

The invention relates to a method of manufacturing an electric device, for example, a semiconductor device comprising a substrate, a surface of which is at least partially provided in a stage of manufacture with a layer of a less noble metal, that is, a more active metal in accordance with the well known electromotive series, and subsequently with a layer of a nobler metal, said layers having a common contact surface and being subjected with the aid of an etching-resistant layer to an etching treatment and to an electric device manufactured by said method.

Apart from a semiconductor device, for example a wiring on an insulating substrate, for example, a printed wiring circuit or a substrate with current conductors for mounting a semiconductor device or a thin-film circuit element may be manufactured by means of the disclosed a method.

For establishing, for example, satisfactory contacts for semiconductor devices, it is often not possible to use only one metal layer, since the conditions to be fulfilled by a satisfactory contact cannot be satisfied by one metal. In the method concerned, for example, the less noble metal layer may serve for satisfactory adhesion to and for obtaining a low contact resistance on the substrate and the nobler metal layer may serve for satisfactory current conduction and for the connection of current conductors.

A method of the kind set forth is known from British patent specification 1,166,202.

In said method, the process is often as follows: in the etching process the etching-resistant layer is formed by a photo-lacquer layer and the desired pattern of apertures is provided therein by exposure via a photo-mask and by development of the photo-lacquer layer.

When etching the nobler metal layer under-etching of this metal layer occurs beneath the photo-lacquer layer. Under-etching is a phenomenon known per se, which can be taken into account in determining the size of the apertures in the mask and the choice of, for example, the duration of the etching process.

When etching the less noble metal layer either in an etching solution attacking both metals simultaneously or in an etching solution being specific for the less noble metal layer under-etching also occurs.

It has been found that under-etching of the less noble metal layer takes place at a high rate and can thus be controlled only with difficulty, so that, especially when employed for example for etching a fine pattern of wiring and contacts in the metal layers on a semiconductor body said method is less suitable or not suitable at all. Presumably the rapid etching of the less noble metal layer is to be attributed to the fact that in the etching solution this layer forms a galvanic element with the nobler metal layer locally, so that the less noble metal layer serves as an anode and dissolves rapidly.

The rapid etching of the less noble metal layer might be avoided by first applying to the surface of the semiconductor body the less noble metal layer, which is then provided with the desired pattern with the aid of a photo-etching treatment. Then, the less noble metal layer free of the photo-lacquer layer may have deposited on it the nobler metal layer and it may be provided with the desired pattern also by means of a photo-etching process, in which case the nobler metal layer often has to be etched with an etchant specific for this layer. However, this process is complicated since a mask has to be orientated twice. Moreover, the second step of mask alignment introduces inaccuracy, which is undesirable for applying a fine wiring and contact pattern.

The invention has for its object inter alia to prevent the rapid etching of the less noble metal layer in the etching solution. It is based on the recognition of the fact that an important improvement is achieved when the less noble and the nobler metal layers are prevented from forming a galvanic element in the etching solution.

The method described above is characterized in accordance with the invention in that prior to etching of the less noble metal layer, the whole nobler metal layer and the surface of the less noble metal layer beyond the contact surface, at least over a strip adjacent the whole edge of the contact surface, are provided with the etching-resistant layer.

It should be noted that where reference is made to a layer, a surface, a strip or an edge these may be interrupted parts.

The advantage of the method according to the invention resides in that owing to the complete covering of the nobler metal layer with the etching-resist layer the nobler metal layer and the less noble metal layer can no longer form a galvanic element so that etching of the less noble metal layer can be better regulated.

In a preferred form of the method according to the invention, the nobler metal layer is etched and subsequently the etching-resistant layer is softened so that the softened resist layer bulges out and covers the edge of the contact surface and the adjacent strip of the surface of the less noble metal layer. This provides the important advantage that it is not necessary to align twice a photomask. A further advantage of this preferred embodiment is that the less noble and the nobler metal layers can be applied immediately one after the other in a single operation, so that oxidation of the less noble metal layer, which is often sensitive to oxidation, can be avoided.

The method according to the invention profits from the fact that in etching the nobler metal layer by under-etching of said layer beneath the etching-resistant layer portions of the etching-resistant layer extend beyond the nobler metal layer. During softening the etching-resistant layer also covers the edges of the nobler metal layer. During the subsequent etching of the less noble metal layer, under-etching of said metal layer beneath the bulging resist layer occurs. It has of course to be ensured that this under-etching is not continued to an extent such that the etchant simultaneously comes into contact also with the nobler metal layer, which might again give rise to the formation of a galvanic element as described above. Softening of the resist layer may be performed in various ways, for example, by heating.

The etching-resistant layer is preferably softened by treating it with a known solvent or swelling agent for the said layer. For the material of the etching-resistant layer a great variety is offered, for example, by organic compounds. The etching-resistant layer is preferably a photo-lacquer layer.

Conventional solvents or swelling agents for positive photo-lacquers, i.e. lacquers which become better soluble by exposure in an appropriate solvent and which contain as a binder for example phenolformaldehyde resins, are for example ketones such as acetone and methylethylketone and alcohols such as isopropanol.

Conventional solvents or swelling agents for negative photo-lacquers, i.e. lacquers which become less soluble in an appropriate solvent by exposure and which may contain hydrocarbon compounds, are for example, the xylenes.

The solvent or swelling agent is preferably used in the vapour phase. This permits controlling particularly the softening process, especially when solvents are used.

Subsequent to etching of the nobler metal layer it is preferable to deposit an aligned masking layer to the surface of the substrate, after which the etching-resistant layer is oftened and subsequently the masking layer is removed. The aligned deposition may be performed from the vapour phase.

This form provides the often desired advantage that the softened etching-resistant layer covers only a restricted portion of the surface of the less noble metal layer located beyond the contact surface. The latter surface is then covered for the major part with the masking layer which is removed after the etching-resistant layer has bulged out. This masking layer is, of course, not located beneath the portions of the etching-resistant layer extending beyond the nobler metal layer. If the etching-resistant layer is formed by a positive photo-lacquer layer, the masking layer may serve at the area where it covers the nobler metal layer as a photo-mask so that after widening of the photo-lacquer layer after exposure and after dissolving of the exposed part of the widened photo-lacquer layer in an appropriate solvent, the surface of the less noble metal layer is satisfactorily accessible to the etchant.

The substrate is preferably formed by a semiconductor body which is provided with an oxide layer in which windows are provided, after which the surface of the oxide layer and that of the exposed semiconductor body in the windows are provided in order of succession by deposition with a chromium layer and a silver layer, over which a positive lacquer layer is applied, which is softened by acetone in the vapour phase subsequent to etching of the silver layer.

By this variant of the method, a semiconductor device can be manufactured which has a very fine contact and wiring pattern and which is suitable for use at frequencies lying in the gHz. range.

The invention will be described more fully with reference to the accompanying drawing and to two examples.

EXAMPLE I

Figure 1:
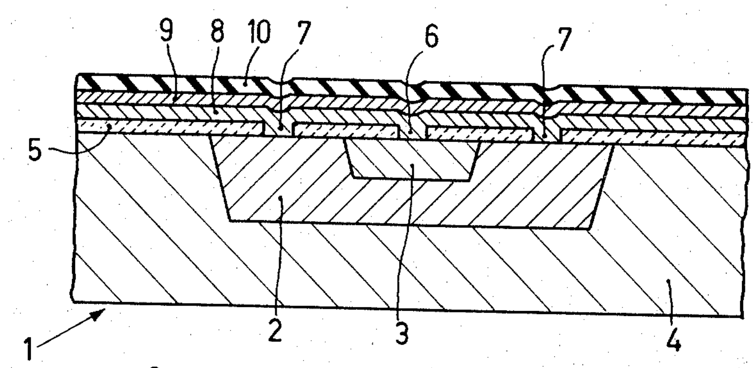
FIGS. 1 to 5 are schematic cross sectional views of consecutive stages of the manufacture of a semiconductor device in accordance with one variant of the method embodying the invention.

The manufacture of a planar transistor, as shown in FIG. 1, suitable for use at 4 gHz. starts from a substrate 1 of germanium having a diameter of 2 cms., a thickness of 200$\mu$ and doped with an impurity providing n-type conductivity and having a resistivity of 0.1 to 0.25 ohm/cm. In a conventional manner, by using gallium and subsequently arsenic a base zone 2 and an emitter zone 3 respectively are diffused into the substrate. The remaining part of the substrate serves as a collector zone 4.

In a conventional manner, the substrate 1 is provided with a silica layer 5 having apertures 6 and 7 for contacting the emitter and base zones 3, 4 respectively. For the sake of simplicity, contacting of the collector zone is not described herein, since it may be done in a corresponding manner.

The oxide layer 5 and the emitter and base zones 3, 4 in the apertures are provided in a conventional manner with a less noble metal layer 8 of chromium, on which a nobler metal layer 9 of silver is applied from the vapour phase. The layers 8 and 9 are applied immediately one after the other without interrupting the vacuum in the vapour deposition apparatus. The method according to the invention permits of applying the layers 8 and 9 immediately one after the other so that oxidation of the chromium layer is avoided. The chromium layer has a resistance of 700 ohms/square and the silver layer has a resistance of 0.14 to 0.11 ohm/square. These two values are measured in a conventional manner in the vapour-deposition apparatus during the vapour deposition by applying these layers to a glass test plate and by determining the resistance per square. The thickness of the chromium layer is of the order of magnitude of 0.1$\mu$ or less.

Figure 2:
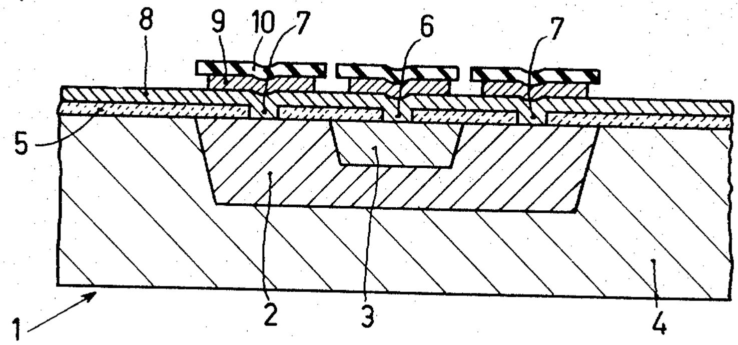

The silver layer 9 is then provided with an etching-resistant layer 10 of a positive photo-lacquer commercially known under the trademark of Shipley. The layer 10 is baked at a comparatively low temperature, i.e. 90° C. for some time to harden it. This photo-lacquer layer is then provided with a photomask (not shown in the drawing) with the desired pattern of current conductors and contacts, after which it is exposed and the exposed part of the photo-lacquer layer 10 is dissolved in a solvent suitable for the photo-lacquer so that the photo-lacquer layer 10 is interrupted as shown in FIG. 2.

Then, the silver layer 9 is etched in a conventional manner by dipping the substrate for 10 to 15 seconds in a solution consisting of 25% by volume of 65% $HNO_3$, 50% by volume of 98% acetic acid and 25% by volume of $H_2O$ at 15° C. The silver layer is interrupted by etching.

The photo-lacquer layer is subsequently softened by exposing it to a stream of air having passed a flushing flask containing acetone at room temperature.

Figure 3:
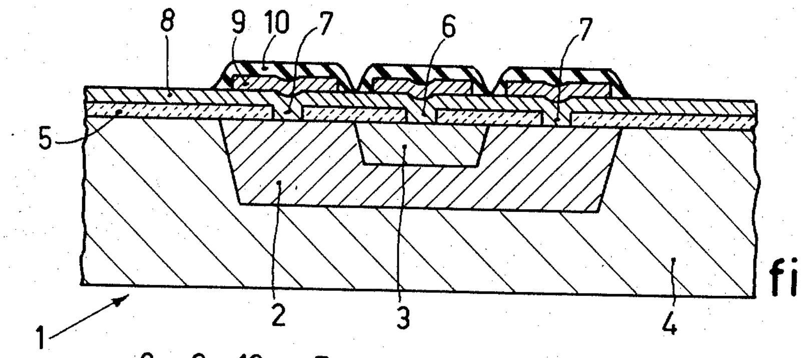

By this treatment the photo-lacquer layer 10 assumes the shape shown schematically in FIG. 3. The assembly is subsequently heated at 140° C. for a sufficient time in order to evaporate the acetone from the photo-lacquer layer and reharden the layer.

After etching of the silver layer, silver patches may still be found on the chromium layer. They can be dissolved very rapidly in a solution containing 15 g. of $Fe(NO_3)_3$ per 100 mls. of $H_2O$ at 20° C.

The chromium layer is subsequently etched in a solution containing 80% by volume of about 40% HCl and 20% by volume of $H_2O$ at 30° C. Other well known etchants for the chromium can also be used.

It is not quite possible to indicate an accurate duration of the etching process. Some time elapses before the solution of the chromium layer starts and this instant is marked by the beginning of gas generation.

Figure 4:
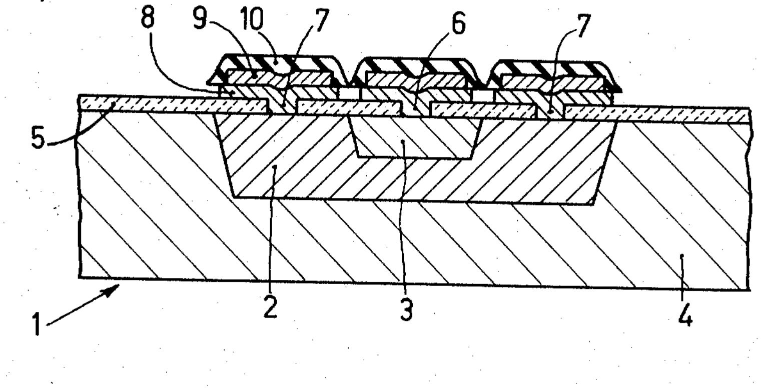
Figure 5:
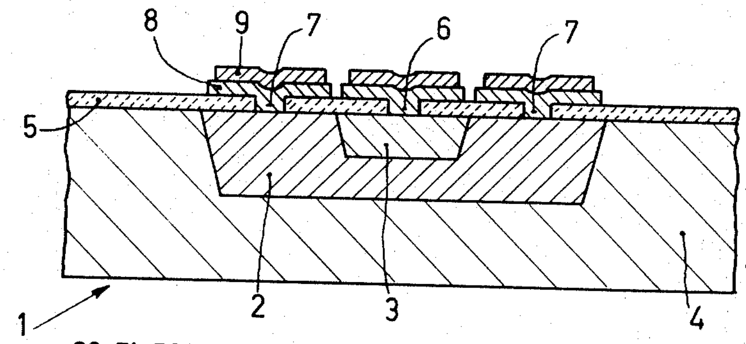

Etching is continuous until the instant when the gas generation terminates. Then, the situation shown in FIG. 4 is obtained. Subsequently, the photo-lacquer layer 10 is removed as shown in FIG. 5 and after the metal layers with the substrate have been sintered at a high temperature, the transistor is provided in a conventional manner with current conductors, and if necessary, with an envelope.

EXAMPLE II

Figure 6:
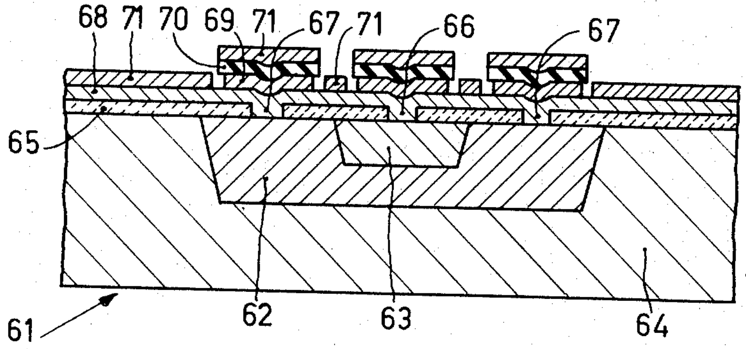
FIGS. 6 to 8 are schematic cross sectional views of consecutive stages of the manufacture of a semiconductor device in accordance with a further variant of the method embodying the invention. For the sake of clarity, especially the dimensions in the direction of thickness are shown on a strongly enlarged scale in the figures.

For the manufacture of a different planar transistor the process is as described in Example I up to and including etching of the silver layer. Subsequently, the chromium layer 68 has deposited on it from the vapour phase, in a conventional manner, a masking layer 71 of aluminium with the aid of the photo-lacquer layer 70 as a mask as shown in FIG. 6. This masking layer is not located under the portions of the photo-lacquer layer 70 extending beyond the silver layer 69.

FIG. 6 shows a substrate 61, a base zone 62, an emitter zone 63, a collector zone 64, a silica layer 65, an emitter-contact aperture 66 in said layer and base contact apertures 67.

Figure 7:
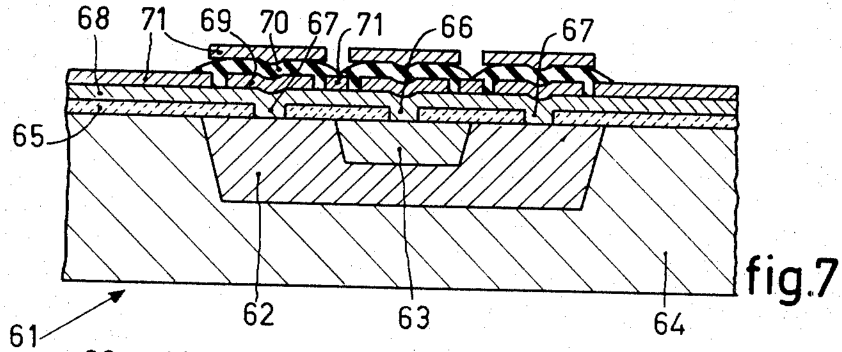
Figure 8:
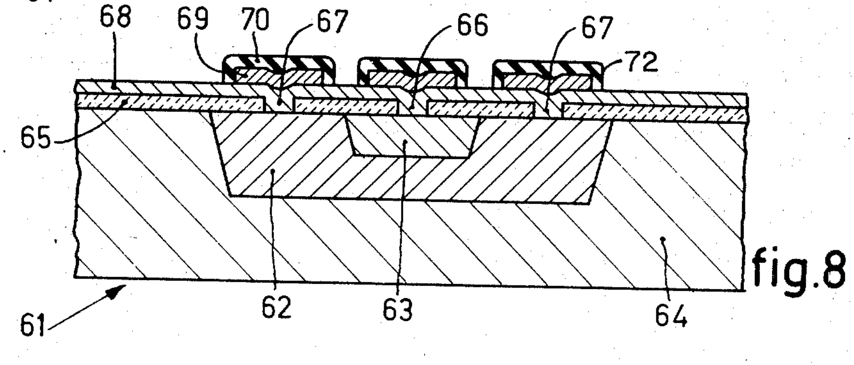

As in Example I, the photo-lacquer layer 70 is softened by acetone vapour so that the situation illustrated in FIG. 7 is obtained. During the subsequent exposure, the masking layer 71 serves at the area where it covers the silver layer as a photo-mask so that after dissolving the exposed portion of the widened photo-lacquer layer in the appropriate solvent and after the removal of the aluminium layer, the surface of the chromium layer 68 is readily accessible to the etchant as shown in FIG. 8. The accessibility is furthered in this variant of the method because the photo-lacquer layer 70 has steep edges 72.

Etching of the chromium layer 68 and the further operations are carried out in the same manner as described in Example I.

The method according to the invention is of course not restricted to the variants described in the examples and to the manufacture of transistors.

For the substrate, for example, a different semiconductor material, for instance silicon or an insulating material may be chosen.

Rapid etching has also been stated with other combinations of less noble and nobler metal layers other than Cr and Ag, for example, with the combination of Cr with Al or Au or Ti with Au.

Apart from photo-lacquers the etching-resistant layers may be formed by various known kinds of wax and thermoplastic materials.

What is claimed is:

1. A method of manufacturing an electric device comprising a substrate having a conductive pattern thereon, said method comprising the steps of depositing a layer of a first metal on a surface of the substrate, depositing a layer of a second metal on the first metal layer, said first metal layer being more active than said second metal in accordance with the electromotive series, said first and second metal layers having a common contact surface, said second metal layer having an edge on said first metal layer, depositing an etching-resistant layer on the whole surface of the second metal layer, removing a portion of the second metal layer so that said etching-resistant layer overhangs the edge of said second metal layer, softening the etching-resistant layer to cause the overhanging portion thereof to cover the edge of the second metal layer to avoid a galvanic action between the first and second metal layers at the edge of the second metal layer during a subsequent etching of the first metal layer, and etching the first metal layer while the etching-resistant layer covers the edge of the second metal layer.

2. A method as claimed in claim 1, wherein the substrate is a semiconductor body.

3. A method as claimed in claim 1, wherein the etching-resistant layer is softened by applying heat.

4. A method as claimed in claim 1, wherein the etching-resistant layer is softened by applying a swelling agent in a vapor phase.

5. A method as claimed in claim 1, wherein the etching-resistant layer is a photo-lacquer layer.

6. A method as claimed in claim 4, wherein the substrate, the first metal, the second metal, and the etching-resistant layer correspond respectively to a semiconductor body having an oxide layer provided with at least one window, chromium, silver, and a positive photo-lacquer layer and acetone in a vapor phase is used for softening the etching-resistant layer.

7. A method as claimed in claim 1, wherein the etching-resistant layer is a positive photo-lacquer and further comprising the steps of depositing a radiation impermeable layer on the etching-resistant layer and portions of the second metal layer not shielded by the overlapping parts of the etching-resistant layer before softening the overhanging parts of the etching-resistant layer and exposing the etching-resistant layer to radiation subsequent to the step of softening the overhanging etchings-resistant layer so that the part of the etching-resistant layer not shielded by the radiation impermeable layer can be removed with a solvent, and removing the part of the etching-resistant layer exposed to radiation and removing the radiation impermeable layer.

References Cited

FOREIGN PATENTS 1,042,106 6/1953 France ............. 156—11

OTHER REFERENCES

Fabrication of Metal Masks by Wirtz, IBM Tech Discl. Bulletin, vol. 10, No. 8, January 1968, pp. 1126–7.

JACOB H. STEINBERG, Primary Examiner

U.S. Cl. X.R.

29—578; 156—13, 17

PO-1050
(5/69)

UNITED STATES PATENT OFFICE
CERTIFICATE OF CORRECTION

Patent No. 3,695,955 Dated October 3, 1972

Inventor(s) PIETER JOHANNES WILHELMUS JOCHEMS & REINIER DE WERDT

It is certified that error appears in the above-identified patent and that said Letters Patent are hereby corrected as shown below:

On the Title page the Assignee was not indicated it should be --U. S. Philips Corporation--.

Signed and sealed this 17th day of April 1973.

(SEAL)
Attest:

EDWARD M.FLETCHER,JR.
Attesting Officer

ROBERT GOTTSCHALK
Commissioner of Patents